United States Patent
Yang et al.

(10) Patent No.: US 8,254,112 B2
(45) Date of Patent: Aug. 28, 2012

(54) COMPACT HEAT DISSIPATION DEVICE

(75) Inventors: Jian Yang, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 147 days.

(21) Appl. No.: 12/837,485

(22) Filed: Jul. 15, 2010

(65) Prior Publication Data

US 2011/0261533 A1 Oct. 27, 2011

(30) Foreign Application Priority Data

Apr. 26, 2010 (CN) .......................... 2010 1 0155806

(51) Int. Cl.
*G06F 1/20* (2006.01)
*H05K 7/20* (2006.01)

(52) U.S. Cl. ......... 361/679.47; 361/679.48; 361/679.49; 361/679.52; 361/679.54; 361/695; 361/697; 361/700; 361/703; 361/704; 165/80.3; 165/185; 174/15.2; 174/16.1; 174/16.3

(58) Field of Classification Search .......... 361/679.46–679.49, 679.52, 679.54, 361/690, 694–695, 697–700, 703, 704; 165/80.2–80.4, 104.33, 185; 174/15.2, 16.1, 174/16.3

See application file for complete search history.

(56) References Cited

U.S. PATENT DOCUMENTS

| | | | |
|---|---|---|---|
| 7,333,340 B2 * | 2/2008 | Zhang et al. | 361/719 |
| 7,345,874 B2 * | 3/2008 | Cheng et al. | 361/695 |
| 7,359,197 B2 * | 4/2008 | Stefanoski et al. | 361/699 |
| 7,542,292 B2 * | 6/2009 | Stefanoski et al. | 361/699 |
| 7,613,000 B2 * | 11/2009 | Hung et al. | 361/695 |
| 8,085,542 B2 * | 12/2011 | Yang | 361/719 |
| 8,120,918 B2 * | 2/2012 | Liu | 361/700 |
| 2007/0029071 A1* | 2/2007 | Hwang et al. | 165/104.33 |
| 2011/0146954 A1* | 6/2011 | Liu | 165/104.26 |
| 2011/0149516 A1* | 6/2011 | Yang | 361/697 |
| 2011/0186269 A1* | 8/2011 | Yang et al. | 165/104.26 |
| 2011/0261532 A1* | 10/2011 | Yang | 361/697 |

* cited by examiner

*Primary Examiner* — Robert J Hoffberg
(74) *Attorney, Agent, or Firm* — Altis Law Group, Inc.

(57) ABSTRACT

A heat dissipation device for dissipating heat from an electronic component. The heat dissipation device includes a shroud having a bottom wall and a sidewall partially surrounding the bottom wall, a base mounted on a bottom of the bottom wall, a bracket fixed on a top of the bottom wall, an impeller rotatably mounted on the bracket, a fin assembly arranged on the bottom wall, a plurality of heat pipes connecting the fin assembly with the base, and a cover secured on the sidewall. An end of the bottom wall extends beyond the sidewall to support the fin assembly thereon. An opening and a window are respectively defined in the bottom wall and the cover. A plate is formed within the opening of the bottom wall and connects the bracket with the base.

20 Claims, 4 Drawing Sheets

COMPACT HEAT DISSIPATION DEVICE

BACKGROUND

1. Technical Field

The present disclosure relates to heat dissipation devices and, more particularly, to a heat dissipation device occupying a small volume.

2. Description of Related Art

Nowadays, many kinds of electronic components have higher working frequencies, due to the promotion and development of semiconductor technologies. The higher working frequency raises the processing capability of such electronic components. However, it also means that the electronic component is liable to produce much more heat than previously. Thus, the heat must be dissipated from the electronic component in a timely manner in order that the electronic component can maintain normal, stable operation.

One kind of conventional heat dissipation device includes a base contacting the electronic component for absorbing heat generated therefrom, and a plurality of fins arranged on the base for dissipating the heat into the ambient atmosphere. A fan may be incorporated into the heat dissipation device to facilitate the heat dissipation with forced airflow. In order to increase the airflow-utilizing efficiency, a fan duct may be used with the fan to guide the airflow towards the fins. However, incorporating the fan into the heat dissipation device may considerably enlarge the volume of the heat dissipation device, whereby the heat dissipation device fails to meet the stringent space requirements of small computer systems.

What is needed, therefore, is a heat dissipation device which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
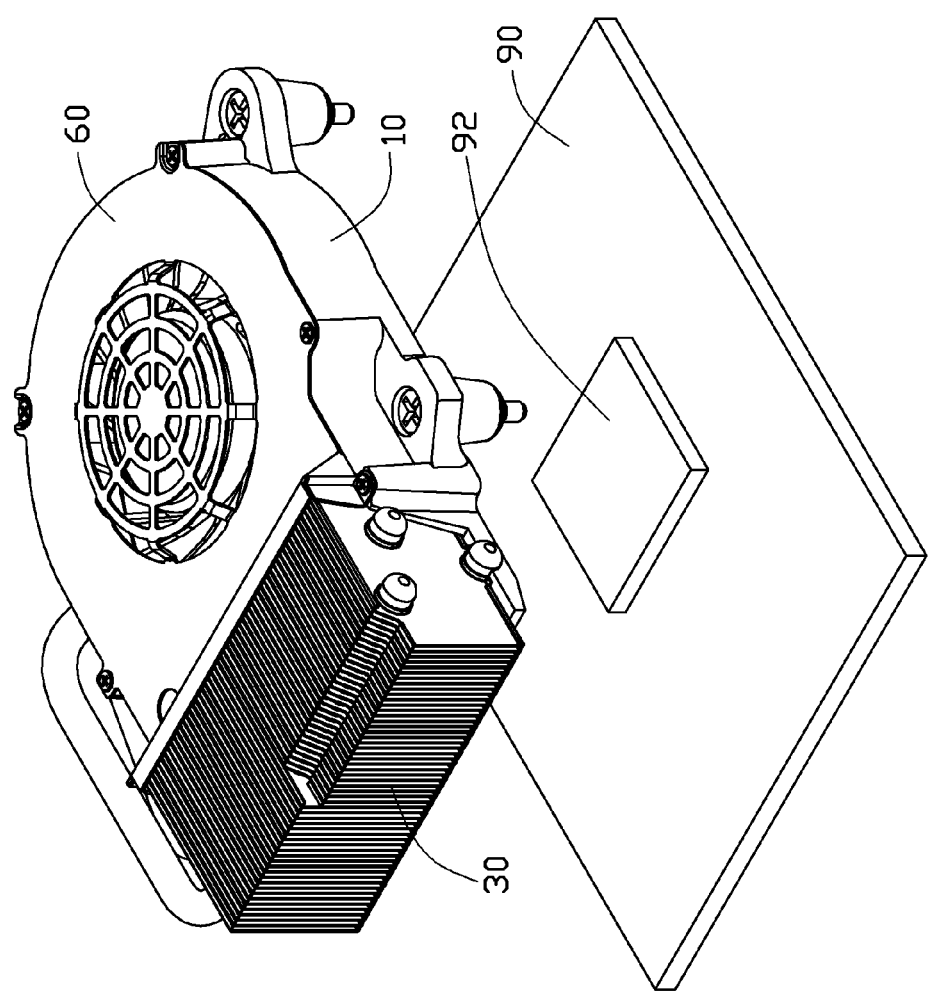
FIG. 1 is an isometric view of a heat dissipation device of the present disclosure, showing the heat dissipation device ready to be mounted on an electronic component located on a printed circuit board.
Figure 2:
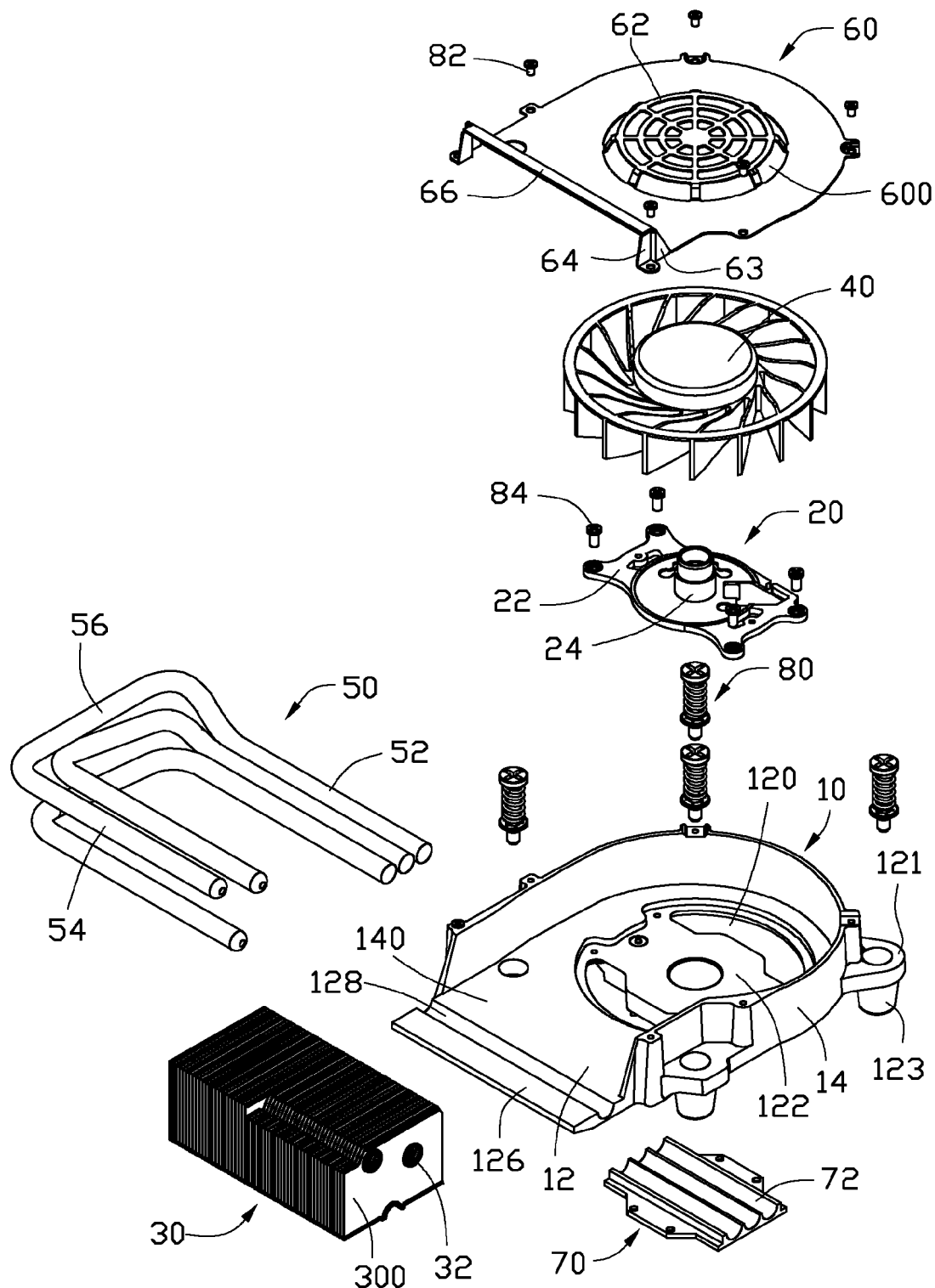
FIG. 2 is an exploded view of the heat dissipation device of FIG. 1.

Referring to FIGS. 1-2, a heat dissipation device of the present disclosure is shown. The heat dissipation device includes a shroud 10, a base 70 connected to the shroud 10, a bracket 20 secured on the shroud 10, an impeller 40 rotatably mounted on the bracket 20, a cover 60 attached on the shroud 10, a fin assembly 30 secured on the shroud 10, and three heat pipes 50 extending through the fin assembly 30 and retained between the shroud 10 and the base 70. The heat dissipation device is disposed on a printed circuit board 90 having an electronic component 92 mounted on a center thereof, for dissipating heat from the electronic component 92.

Figure 3:
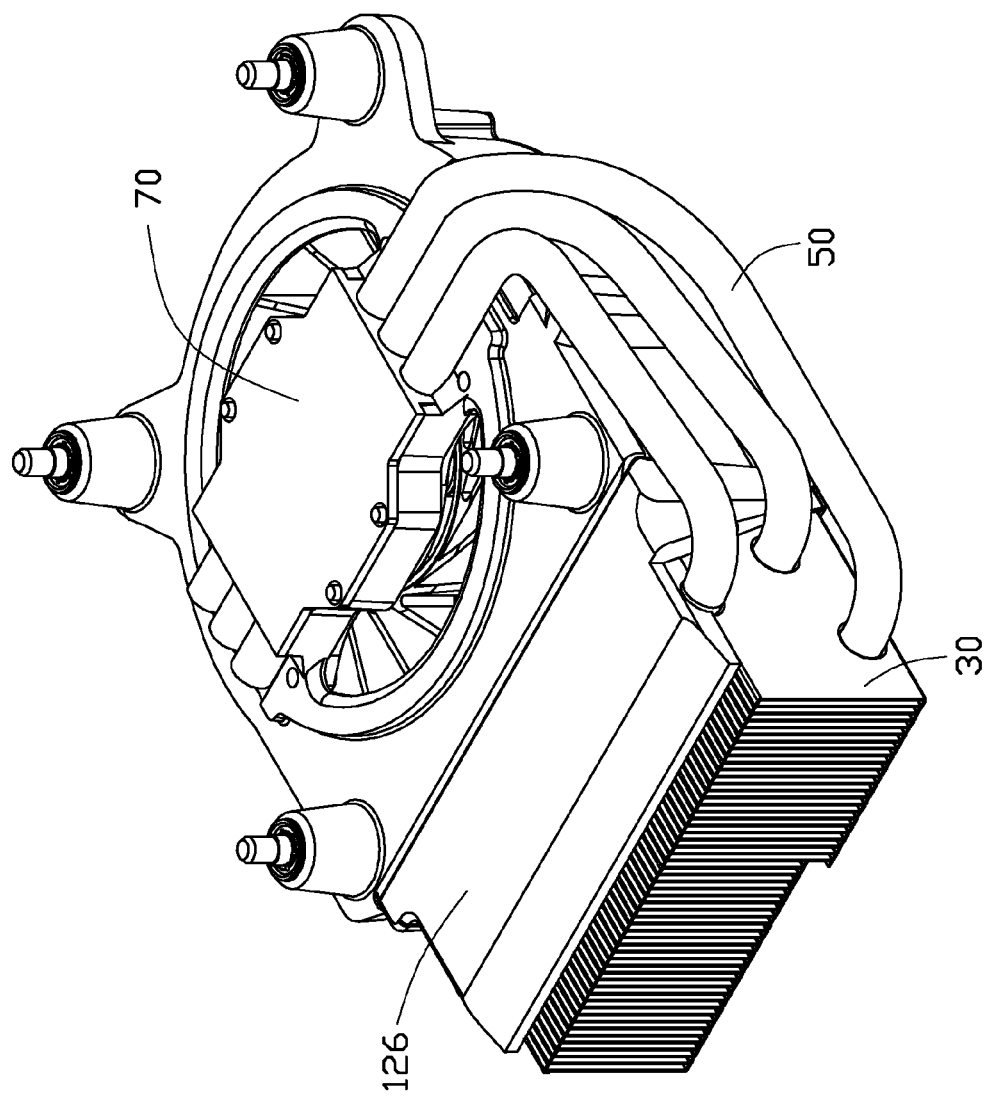
FIG. 3 is an inverted view of the heat dissipation device of FIG. 1.
Figure 4:
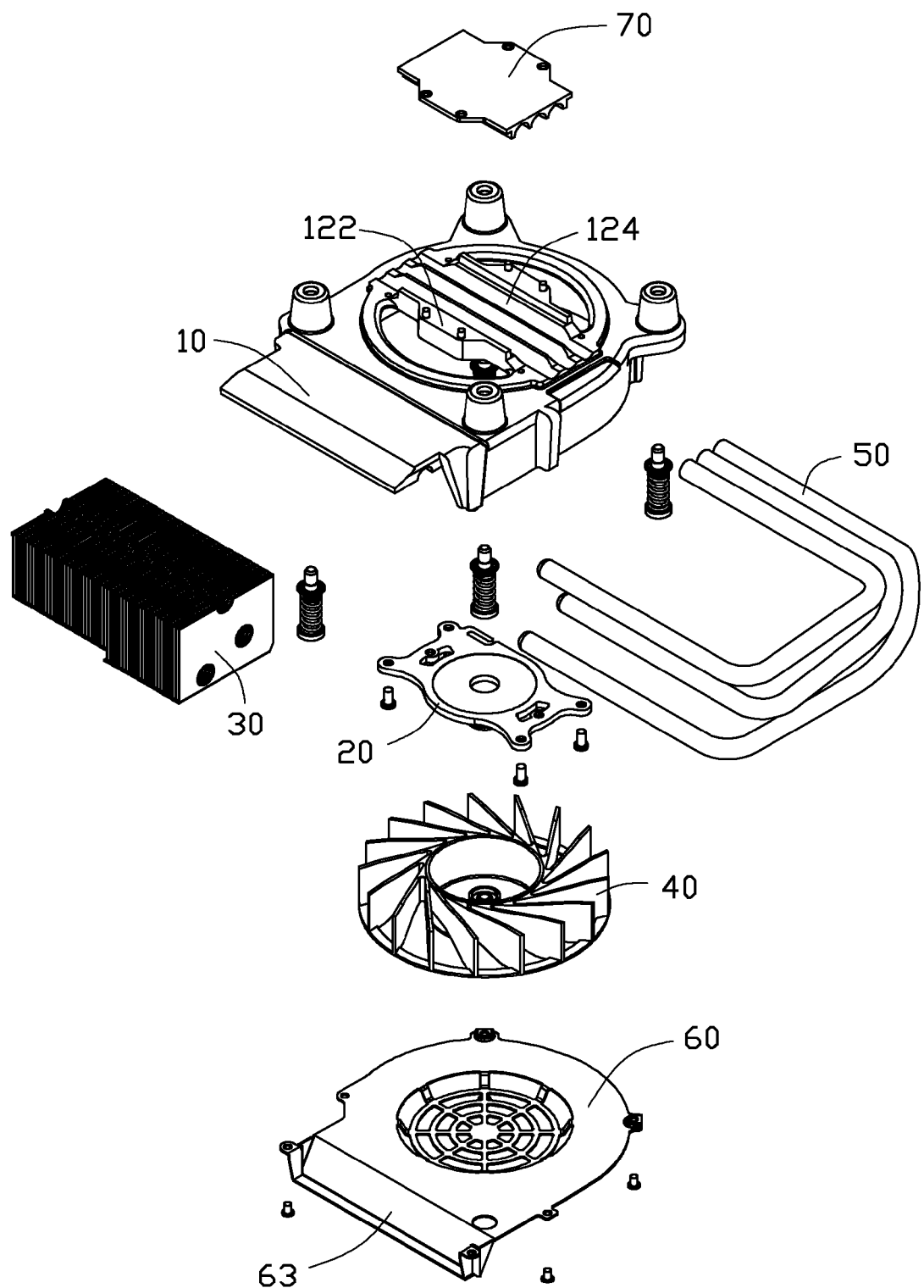
FIG. 4 is an inverted view of the heat dissipation device shown in FIG. 2.

Also referring to FIGS. 3-4, the shroud 10 is integrally made from a piece of metal such as copper or aluminum. That is, the shroud 10 is a one-piece body of the same material. The shroud 10 includes a bottom wall 12 having a rectangular part and a semicircular part adjoining the rectangular part. The bottom wall 12 defines a circular opening 120 at a region where the semicircular part adjoins the rectangular part. A plate 122 is formed within the opening 120, and adjoins an inner circumference of the bottom wall 12 which defines the opening 120. Three grooves 124 are defined in a bottom of the plate 122 for receiving the heat pipes 50. The shroud 10 also includes a sidewall 14 extending upwardly from a circumferential periphery of the bottom wall 12. The sidewall 14 partially surrounds the bottom wall 12 in a manner that an end of the rectangular part of the bottom wall 12 is located beyond ends of the sidewall 14, thereby defining a bridge 126 at a side of the shroud 10. The sidewall 14 defines a gap 140 at a place above the bridge 126. A channel 128 is defined in a top of the bridge 126 to receive a corresponding heat pipe 50 therein. The shroud 10 has four ears 121 extending horizontally and outwardly from a bottom of the sidewall 14, and four feet 123 protruding downwardly from the four ears 121, respectively. The four ears 121 and four feet 123 are all located outside the sidewall 14, so that the ears 121 and the feet 123 do not interfere with airflow generated by the impeller 40 within the shroud 10. Four fasteners 80 are extended through the four ears 121 and four feet 123 into the printed circuit board 90, to secure the shroud 10 on the printed circuit board 90.

The base 70 is attached on the bottom of the plate 122. The base 70 has a bottom contacting the electronic component 92 to absorb the heat from the electronic component 92. The base 70 has three grooves 72 defined in a top thereof, corresponding to the three grooves 124 of the plate 122, to retain the heat pipes 50 therein.

The fin assembly 30 is mounted on the bridge 126 of the bottom wall 12. The fin assembly 30 is comprised of multiple fins 300 connected to each other in a horizontal stack. Three slots 32 are defined through the fin assembly 30 to receive the heat pipes 50. Each heat pipe 50 includes an evaporating section 52, a condensing section 54 parallel to the evaporating section 52 and an adiabatic section 56 interconnecting the condensing section 54 and the evaporating section 52. The evaporating sections 52 of the heat pipes 50 are juxtaposedly accommodated in the grooves 124 of the plate 122 and the grooves 72 of the base 70. Two upper condensing sections 54 of the heat pipes 50 are inserted into two corresponding slots 32 of the fin assembly 30; and one lower condensing section 54 of the heat pipes 50 is received in the channel 128 of the bridge 126 and the remaining slot 32 of the fin assembly 30.

The bracket 20 includes a chassis 22 fixed on the plate 122 of the bottom wall 12, and a post 24 extending upwardly from a center of the chassis 22. The chassis 22 has a profile coinciding with that of the plate 122, so that the chassis 22 does not block the airflow generated by the impeller 40 when the bracket 20 is placed on the plate 122. Four screws 84 extend through the chassis 22 and the plate 122 and into the base 70, to thereby secure the bracket 20, the bottom wall 12 and the base 70 together. The impeller 40 is rotatably mounted on the post 24 to force the air to flow through the fin assembly 30.

The cover 60 is fixed on a top of the sidewall 14 by four screws 82. The cover 60 has a profile similar to that of the sidewall 14. The cover 60 defines a circular window 600 in a central area thereof, and has a protective cage 62 formed over the window 600. The window 600 is located lower than a top of the fin assembly 30, so that a thickness of the heat dissipation device at the place corresponding to the impeller 40 can be reduced and optimally minimal. An end of the cover 60 corresponding to the bridge 126 of the shroud 10 is configured as a fan duct 63, which gradually expands towards the fin assembly 30. Two upright flanges 64 and a horizontal flange 66 interconnecting the two upright flanges 64 are formed at the end of the cover 60. The three flanges 64, 66 abut against the fin assembly 30 to fix the fin assembly 30 on the bottom wall 12.

When the impeller 40 is energized to operate, the impeller 40 drives air to flow from the ambient atmosphere into the shroud 10 through the window 600 and through the opening 120. The air is expelled out of the shroud 10 through the fin assembly 30 under guidance of the sidewall 14 after exchanging heat with the fin assembly 30, thereby dissipating heat from the electronic component 92 into the ambient atmosphere.

Since the impeller 40, the fins 300, the heat pipes 50 and the sidewall 14 are all at least partially incorporated into or form part of the shroud 10, the whole heat dissipation device can be constructed to occupy a small volume, thereby meeting stringent space requirements of small computer systems.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A heat dissipation device for dissipating heat from an electronic component, the heat dissipation device comprising:
    a shroud comprising a bottom wall and a sidewall extending upwardly from the bottom wall, the sidewall partially surrounding the bottom wall such that an end of the bottom wall is located beyond the sidewall, wherein the bottom wall has an opening defined therein and a plate formed within the opening;
    a bracket secured on the plate of the bottom wall;
    a base mounted on an underside of the plate of the bottom wall, wherein the base and the bracket are located at two opposite sides of the bottom wall;
    a fin assembly fixed on the end of the bottom wall;
    an impeller rotatably mounted on the bracket and located within the shroud; and
    a first heat pipe having an end sandwiched between the base and the plate, and an opposite end sandwiched between the fin assembly and the bottom wall of the shroud at the end of the bottom wall that is located beyond the sidewall.

2. The heat dissipation device of claim 1, wherein the end of the first heat pipe sandwiched between the base and the plate is an evaporating end and the opposite end of the first heat pipe sandwiched between the fin assembly and the bottom wall of the shroud is a condensing end.

3. The heat dissipation device of claim 1, further comprising a second heat pipe having an end sandwiched between the base and the plate and an opposite end extending into the fin assembly.

4. The heat dissipation device of claim 3, wherein the end of the second heat pipe sandwiched between the base and the plate is an evaporating end and the opposite end of the heat pipe extending into the fin assembly is a condensing end.

5. The heat dissipation device of claim 1, wherein the bracket comprises a chassis attached on the plate and a post protruding upwardly from the chassis, the impeller being rotatably mounted on the post.

6. The heat dissipation device of claim 5, wherein the chassis of the bracket has a profile coinciding with that of the plate of the bottom wall.

7. The heat dissipation device of claim 5, further comprising a plurality of fastening elements extending through the chassis of the bracket and the plate of the bottom wall into the base, thereby fastening the bracket, the bottom wall and the base together.

8. The heat dissipation device of claim 1, further comprising a cover mounted on a top of the sidewall, wherein the cover has a window defined therein corresponding to the impeller.

9. The heat dissipation device of claim 8, wherein the fin assembly has a top face located higher than the window of the cover.

10. The heat dissipation device of claim 8, wherein the cover comprises a protective cage formed over the window.

11. The heat dissipation device of claim 8, wherein the cover comprises a fan duct formed on an end thereof, the fan duct gradually expanding towards the fin assembly.

12. The heat dissipation device of claim 11, wherein the fan duct comprises a plurality of flanges abutting against the fin assembly.

13. The heat dissipation device of claim 1, wherein the shroud further comprises a plurality of feet extending downwardly from the sidewall, and the feet are located at an outside of the sidewall.

14. The heat dissipation device of claim 13, further comprising a plurality of fasteners extending downwardly through the feet of the shroud for securing the shroud on a circuit board where the electronic component is mounted.

15. The heat dissipation device of claim 1, wherein the sidewall and the bottom wall are portions of one same single body of material.

16. The heat dissipation device of claim 1, wherein the shroud is made from a single piece of metal.

17. A heat dissipation device for dissipating heat from an electronic component, the heat dissipation device comprising:
    a shroud comprising a bottom wall and a sidewall extending upwardly from a periphery of the bottom wall, a bridge extending from the bottom wall of the shroud, the sidewall partially surrounding the bottom wall and defining a gap at one end thereof at a place above the bridge, wherein the bottom wall has an opening defined therein and a plate formed within the opening;
    a bracket secured on the plate;
    a base mounted on an underside of the plate, wherein the base and the bracket are located at two opposite sides of the bottom wall;
    an impeller rotatably mounted on the bracket;
    a plurality of fins arranged on the bridge of the shroud at the gap; and
    a heat pipe having an end sandwiched between the base and the plate, and an opposite end sandwiched between the plurality of fins and the bridge of the shroud.

18. The heat dissipation device of claim 17, wherein the end of the heat pipe sandwiched between the base and the plate is an evaporating end and the opposite end of the heat pipe sandwiched between the plurality of fins and the bottom wall of the shroud is a condensing end.

19. The heat dissipation device of claim 17, further comprising a cover fixed on the sidewall, wherein the cover defines a window therein and the bottom wall defines an opening corresponding to the window.

20. The heat dissipation device of claim 19, wherein the impeller is located between the cover and the bottom wall, and the cover comprises a fan duct gradually expanding towards the plurality of fins.

* * * * *